(12) United States Patent
Iguchi et al.

(10) Patent No.: US 12,034,105 B2
(45) Date of Patent: Jul. 9, 2024

(54) IMAGE DISPLAY ELEMENT

(71) Applicant: Sharp Fukuyama Laser Co., Ltd., Fukuyama (JP)

(72) Inventors: Katsuji Iguchi, Fukuyama (JP); Hidenori Kawanishi, Fukuyama (JP); Shinsuke Anzai, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 302 days.

(21) Appl. No.: 17/459,930

(22) Filed: Aug. 27, 2021

(65) Prior Publication Data
US 2022/0069186 A1 Mar. 3, 2022

(30) Foreign Application Priority Data

Aug. 31, 2020 (JP) ................................. 2020-145706

(51) Int. Cl.
| | |
|---|---|
| *H01L 33/62* | (2010.01) |
| *G09G 3/32* | (2016.01) |
| *H01L 25/075* | (2006.01) |
| *H01L 25/16* | (2023.01) |

(52) U.S. Cl.
CPC ............... *H01L 33/62* (2013.01); *G09G 3/32* (2013.01); *H01L 25/0753* (2013.01); *G09G 2300/0426* (2013.01); *H01L 25/167* (2013.01)

(58) Field of Classification Search
CPC .............................. H01L 33/62; H01L 25/167
See application file for complete search history.

(56) References Cited

U.S. PATENT DOCUMENTS

| | | | |
|---|---|---|---|
| 8,241,932 B1* | 8/2012 | Yu ........................ | H01L 25/0753 |
| | | | 438/455 |
| 8,836,142 B2* | 9/2014 | Park ..................... | H01L 23/481 |
| | | | 257/E23.145 |
| 10,381,381 B1* | 8/2019 | Choi ..................... | H10K 59/00 |
| 2003/0025848 A1 | 2/2003 | Sera et al. | |
| 2009/0224276 A1 | 9/2009 | Igari et al. | |
| 2009/0309103 A1 | 12/2009 | Yagi | |
| 2012/0034723 A1 | 2/2012 | Yagi | |
| 2012/0190145 A1 | 7/2012 | Yagi | |

(Continued)

FOREIGN PATENT DOCUMENTS

| | | |
|---|---|---|
| CN | 107180837 A | 9/2017 |
| CN | 109904186 A | 6/2019 |

(Continued)

*Primary Examiner* — Eugene Lee
(74) *Attorney, Agent, or Firm* — ScienBiziP, P.C.

(57) ABSTRACT

An image display element provides an image display element including a plurality of micro light-emitting elements arrayed in an array manner, and a semiconductor layer at which a drive circuit is disposed, the drive circuit being configured to supply a current to each of the plurality of micro light-emitting elements to cause light to be emitted, in which a transistor that constitutes the drive circuit and a wiring layer are disposed at a first surface of the semiconductor layer, the plurality of micro light-emitting elements are disposed at a second surface of the semiconductor layer that is an opposite side of the first surface, and the transistor and the wiring layer are electrically coupled to the micro light-emitting elements through a through substrate via that extends through the semiconductor layer.

14 Claims, 10 Drawing Sheets

(56) References Cited

U.S. PATENT DOCUMENTS

| | | |
|---|---|---|
| 2013/0257698 A1 | 10/2013 | Toya et al. |
| 2014/0240370 A1 | 8/2014 | Sakairi et al. |
| 2015/0108533 A1 | 4/2015 | Fukumitsu et al. |
| 2015/0129960 A1 | 5/2015 | Hokazono et al. |
| 2015/0213760 A1 | 7/2015 | Toya et al. |
| 2016/0095221 A1* | 3/2016 | Ramachandran ... H01L 25/0657 361/783 |
| 2016/0247448 A1 | 8/2016 | Toya et al. |
| 2017/0287941 A1 | 10/2017 | Toya et al. |
| 2017/0338268 A1* | 11/2017 | Mitsuhashi ....... H01L 27/14636 |
| 2017/0358562 A1* | 12/2017 | Banna ................ H01L 25/50 |
| 2019/0189514 A1* | 6/2019 | Ogita ................. H04N 25/76 |
| 2019/0273179 A1 | 9/2019 | Iguchi et al. |
| 2020/0098729 A1* | 3/2020 | Pendse ................ H01L 24/08 |
| 2020/0126969 A1 | 4/2020 | Takahashi |
| 2020/0143743 A1 | 5/2020 | Toya et al. |
| 2020/0266180 A1* | 8/2020 | Pendse ................ H01L 24/16 |
| 2021/0125978 A1 | 4/2021 | Takahashi |
| 2021/0158756 A1 | 5/2021 | Toya et al. |
| 2021/0225823 A1 | 7/2021 | Liang et al. |
| 2021/0313298 A1* | 10/2021 | Archer ................ H01L 25/167 |
| 2022/0005972 A1 | 1/2022 | Iguchi et al. |
| 2022/0335893 A1 | 10/2022 | Toya et al. |
| 2023/0170456 A1* | 6/2023 | Hin ................ H01L 33/502 257/79 |
| 2023/0317010 A1 | 10/2023 | Toya et al. |
| 2023/0363213 A1* | 11/2023 | Bae ................ H10K 59/124 |

FOREIGN PATENT DOCUMENTS

| | | |
|---|---|---|
| JP | 2002-141492 A | 5/2002 |
| JP | 2004302475 A | 10/2004 |
| JP | 2009212394 A | 9/2009 |
| JP | 2009300903 A | 12/2009 |
| JP | 2013213979 A | 10/2013 |
| JP | 2014194517 A | 10/2014 |
| JP | 2015095492 A | 5/2015 |
| JP | 2019153783 A | 9/2019 |
| WO | 2013187318 A1 | 12/2013 |
| WO | 2018139188 A1 | 8/2018 |

\* cited by examiner

IMAGE DISPLAY ELEMENT

CROSS-REFERENCE TO RELATED APPLICATION

The present application claims priority from Japanese Application JP2020-145706, the content to which is hereby incorporated by reference into this application.

BACKGROUND

1. Field

The present disclosure relates to an image display element including a micro light-emitting element.

2. Description of the Related Art

There is proposed a display element in which a plurality of micro light-emitting elements that constitute a pixel are disposed on a substrate (backplane). For example, in a technique disclosed in JP 2002-141492 A, a drive circuit is formed on a silicon substrate, and a small-sized light emitting diode (LED) array that emits ultraviolet light is disposed on the drive circuit. In addition, the technique described above discloses a micro display element in which a wavelength conversion layer that converts ultraviolet light into red, green, and blue visible light is provided on the light emitting diode array, thereby displaying a color image. In another form, there is also proposed a method for full color display by using a monochrome display element in which a compound semiconductor that emits blue, green, and red light is layered on a drive circuit.

Such display elements have characteristics such as small size, high brightness, and high durability. Thus, such display elements are expected to be used for glasses-like devices, Head-Up Displays (HUDs), or the like.

SUMMARY

In a micro display element used in glasses-like devices and having high resolution and high brightness, a complementary metal oxide semiconductor (CMOS) circuit is formed on a silicon substrate, and a light-emitting element that emits high-intensity visible light, near-ultraviolet light, or ultraviolent light is layered on the silicon substrate. It is not possible to avoid leakage of light to a driving circuit substrate made of a silicon substrate. An N-well and a P-well are disposed at a surface of the silicon substrate, and each includes a PMOS transistor or NMOS transistor. Light that reaches the surface of the silicon substrate is absorbed by silicon, and an electron-hole pair is generated within both wells. Such electron and positive hole flow into the source and drain of the transistor, resulting in a leakage current of the transistor. If such a leakage current is large, the circuit cannot operate in a designed manner.

In order to avoid the problem described above, it can be conceived to provide a light blocking layer that covers the transistor. If a light blocking layer made of metal is provided, a space is necessary between the light-emitting element and an electrode portion coupled thereto. An interlayer insulating film disposed between wiring lines is transparent, which allows light to reach the transistor through the interlayer insulating film. Thus, it is difficult to completely eliminate the path through which light enters. Such a problem does not happen in a case where light is blocked with an insulating material. However, in order to completely prevent light from entering, an extremely thick layer is necessary. This requires an extremely long wiring line between the driving circuit substrate and the light-emitting element. This causes another problem of increasing an electric resistance or thermal resistance.

A main object of the present disclosure is to, even with a micro display element having high resolution and high brightness, achieve stable and highly accurate control by preventing entry of light into or around a transistor of a driving circuit substrate.

In order to solve the problem described above, an embodiment according to the present disclosure provides an image display element including: a plurality of micro light-emitting elements arrayed in an array manner; and a semiconductor layer at which a drive circuit is disposed, the drive circuit being configured to supply a current to each of the plurality of micro light-emitting elements to cause light to be emitted, in which a transistor that constitutes the drive circuit and a wiring layer are disposed at a first surface of the semiconductor layer, the plurality of micro light-emitting elements are disposed at second surface of the semiconductor layer that is an opposite side of the first surface, and the transistor and the wiring layer are electrically coupled to the micro light-emitting elements through a through substrate via that extends through the semiconductor layer.

In the micro display element having high resolution and high brightness, it is possible to improve the accuracy of control in displaying an image, improve the display quality, and reduce the power consumption by preventing entry of light into or around a transistor that constitutes a driving circuit.

DETAILED DESCRIPTION OF THE INVENTION

Figure 1A:
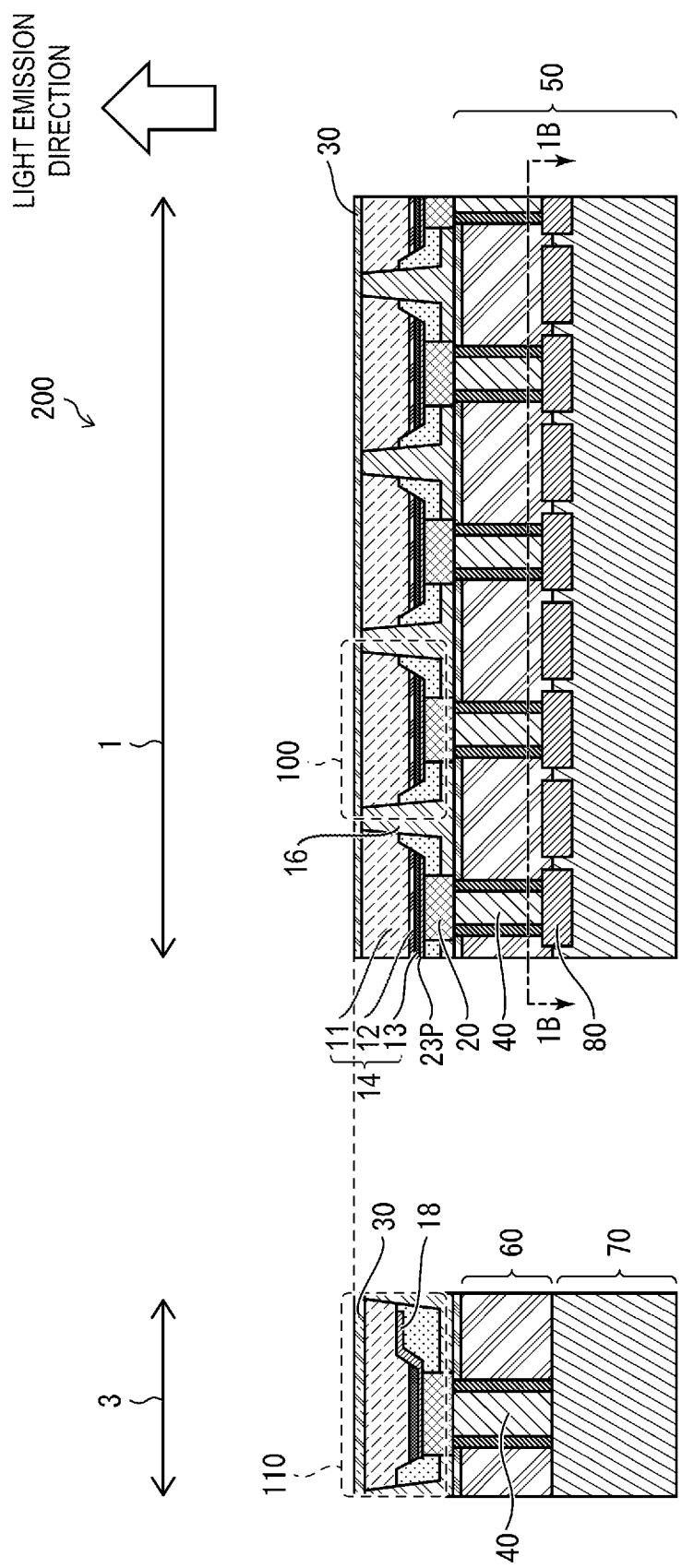
FIG. 1A is a schematic cross-sectional view of an image display element according to a first embodiment of the present disclosure.

Below, embodiments according to the present disclosure will be described with reference to FIGS. 1 to 9 by using, as an example, an image display element including a plurality of micro light-emitting elements. Note that the image display element includes the plurality of micro light-emitting elements and a driving circuit substrate 50. The driving circuit substrate 50 supplies a current to the micro light-emitting elements disposed in a pixel area (pixel region) 1 to control emission of light. The micro light-emitting elements are disposed in an array in the pixel area 1. The micro light-emitting elements emit light in a direction opposite to the driving circuit substrate 50. Unless otherwise specified, the light emitting surface represents a surface at which the micro light-emitting elements emit light into the air. Note that, in the description of the configuration of the image display element, the light emitting surface is referred to as an upper face, a surface disposed at an opposite side of the light emitting surface side is referred to as a lower face, and surfaces disposed at the side and other than the upper face or the lower face are each referred to as a side surface, unless otherwise specified. Similarly, a light emitting direction is referred to as an upper side, and the opposite direction thereof is referred to as a lower side. A direction perpendicular to the light emitting surface and directed toward the air is also referred to as a front.

An electrode disposed at the upper face side of the micro light-emitting element is referred to as a first electrode, and an electrode disposed at the lower face side is referred to as a second electrode. A conductive layer disposed at the upper face side of a compound semiconductor that constitutes the micro light-emitting elements is referred to as a first conductive layer, and a conductive layer disposed at the lower face side is referred to as a second conductive layer. Note that description will be made of a micro light-emitting element configured to use a compound semiconductor as a light-emitting portion. However, for the micro light-emitting element, it may be possible to use a light-emitting element made of other materials such as an organic LED or quantum dot LED.

The driving circuit substrate 50 includes a micro light-emitting element driving circuit that controls the current supplied to each of the micro light-emitting elements disposed in the pixel area 1; and includes a row selection circuit configured to select each row of the micro light-emitting elements disposed in a two-dimensional matrix, a column signal output circuit configured to output a light emission signal to each row, an image processing circuit configured to calculate a light emission signal based on the input signal, an input/output circuit, and the like disposed outside the pixel area 1. The driving circuit substrate 50 is typically a silicon substrate (semiconductor substrate) at which a large scale integration (LSI) is formed and can be manufactured using a known technique. Thus, its function or configuration will not be described in detail. In addition, in the embodiments, a MOS-FET (Field Effect Transistor) is given as an example of a transistor. However, similar configuration is possible even with a bipolar transistor.

Note that the shape of the micro light-emitting element in a plan view is not particularly limited. The micro light-emitting element can be in a variety of planar shapes such as a rectangular shape, a polygonal shape, a circular shape, or an oval shape, and is assumed to have the largest length of no more than 10 µm. The image display element is assumed to have three thousand or greater micro light-emitting elements integrated in the pixel area 1.

First Embodiment

Figure 1B:
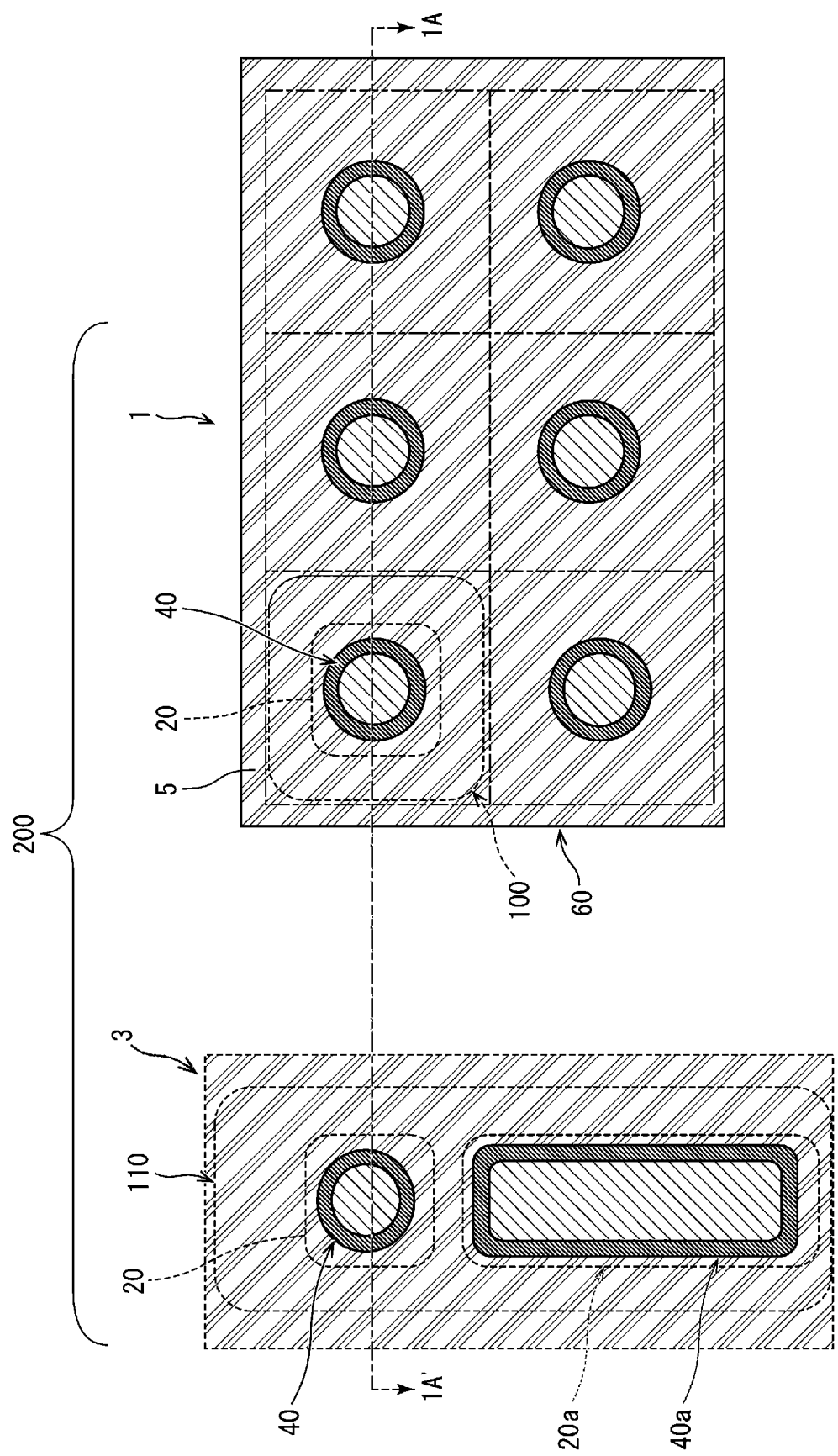
FIG. 1B is a schematic plan view of the image display element according to the first embodiment of the present disclosure.

FIG. 1A is a schematic cross-sectional view illustrating the image display element 200 according to a first embodiment of the present disclosure. FIG. 1B is a schematic plan view. FIG. 1A is a cross-sectional view taken along the portion 1A-1A' in FIG. 1B. FIG. 1B is a plan view taken along the portion 1B-1B in FIG. 1A and illustrates a portion where a through substrate via 40 is disposed. As illustrated in FIGS. 1A and 1B, the image display element 200 includes the pixel area 1 where a plurality of micro light-emitting elements 100 are arrayed in a two-dimensional array manner, and also includes a connection area 3 in which the first electrode 30 of the micro light-emitting element 100 is connected. In the present embodiment, the image display element 200 is a single color display element, and a single micro light-emitting element 100 constitutes a pixel 5. In this configuration, the upper face of the micro light-emitting element 100 serves as a light emitting surface.

The micro light-emitting element 100 includes a compound semiconductor layer 14, a P electrode (second electrode) 23P, and an N electrode (first electrode) 30. The compound semiconductor layer 14 includes a light emission layer 12 configured to output emitted light, an N-type layer (first conductive layer) 11 configured to inject an electron into the light emission layer 12, and a P-type layer (second conductive layer) 13 configured to inject a positive hole into the light emission layer 12. For example, in a case of a micro light-emitting element that emits light with a wavelength band that falls in a range of ultraviolet light to red color, the compound semiconductor layer 14 is a nitride semiconductor (AlInGaN-based), whereas, in a case where light is emitted with a wavelength band that falls in a range of yellow-green to red color, the compound semiconductor layer 14 is an AlInGaP-based one. In a case of a wavelength band that falls in a range of red color to infrared light, the layer is an AlGaAs-based one or GaAs-based one. The compound semiconductor layer 14 may include not only an inorganic compound semiconductor but also an organic electroluminescence element or a quantum dot electroluminescence element.

In a case of the present configuration, description will be made of a configuration of the compound semiconductor layer 14 of the micro light-emitting element 100 in which the N-type layer 11 is disposed at the light emitting side. However, it may be possible to employ a configuration in which the P-type layer 13 is disposed at the light emitting side. Typically, each of the N-type layer 11, the light emission layer 12, and the P-type layer 13 is optimized with a plurality of layers, rather than a single layer. However, this is not directly related to the configuration of the present patent. Thus, the detailed structures of each of the layers will not be described in detail. In FIG. 1A, the compound semiconductor layer 14 is partitioned between adjacent micro light-emitting elements 100. However, N-type layers 11 may be connected.

The driving circuit substrate 50 includes a semiconductor layer 60 and a wiring layer 70. The wiring layer 70 is disposed at the first surface of the semiconductor layer 60. Micro light-emitting elements 100 are arrayed in an array manner at the second surface of the semiconductor layer 60 that is an opposite side of the first surface. The semiconductor layer 60 is made, for example, of a single crystal silicon. However, the semiconductor layer 60 is not limited to this. A transistor 80 that constitutes a drive circuit is disposed at a boundary portion between the wiring layer 70 and the semiconductor layer 60. A channel portion of the transistor 80 or a diffusion layer that constitutes a source and a drain are included in the semiconductor layer 60 side. A wiring line configured to connect terminals of a transistor is included in the wiring layer 70. A P-well 61 and an N-well 64 used to dispose a transistor are disposed at the surface of the semiconductor layer 60 at the first surface side. In addition, a semiconductor layer main body 63 is disposed at the interior thereof. The semiconductor layer main body 63 is, for example, a single crystal silicon substrate itself, or an epitaxial growth layer. Typically, the semiconductor layer main body 63 is a P type but is not limited to this.

A through substrate via 40 is provided at the semiconductor layer 60. In the pixel area 1, the transistor 80 that constitutes a micro light-emitting element drive circuit and a P electrode 23P of the micro light-emitting element 100 are coupled to each other through the through substrate via 40 and an electrode connection section 20. An underfill 16 is used to fill between adjacent micro light-emitting elements 100 and between the micro light-emitting element 100 and the driving circuit substrate 50. The underfill may be made of an inorganic material or an organic material, and preferably has a light blocking property. The underfill may not be provided.

The connection area 3 includes a connection element 110 used to connect an N electrode 30 and a wiring line (for example, ground wiring line) of the driving circuit substrate 50. The connection element 110 includes a compound semiconductor layer 14 identical to the compound semiconductor layer 14 that constitutes the micro light-emitting element 100, and includes an N-wiring line 18 that is electrically conductive to the N electrode 30. The N-wiring line 18 is coupled to the wiring layer 70 through the through substrate via 40 and the electrode connection section 20. Note that the through substrate vias disposed at the connection area 3 may include a large number of through substrate vias disposed along one side of the pixel area 1 and having the same shape as the through substrate via 40 disposed in the pixel area 1. Alternately, as with a through substrate via 40a, it may be possible to dispose a through substrate via having a shape longer than the through substrate via 40. In the pixel area 1, the through substrate vias need to be disposed at pixel pitches, which imposes limitation on the size of the through substrate via 40. However, in the connection area 3, it is possible to dispose the through substrate via 40a having any size. In order to dispose a connecting electrode 20a in the connection area 3 according to the through substrate via 40a, the through substrate via 40a, the size of the connecting electrode in the connection area 3 can be varied in accordance with the size of the through substrate via.

A current passes from the transistor 80 through the through substrate via 40 and the electrode connection section 20, and is supplied to the P electrode 23P. The current passes from the P electrode 23P through the P-type layer 13 into the light emission layer 12, whereby causing light to be emitted. As for a current flowing from the N-type layer 11 to the N electrode 30, the current passes from the N-wiring line 18 of the connection element 110 through the electrode connection section 20 and the through substrate via 40, and then flows to the ground line of the wiring layer 70. In this manner, the driving circuit substrate 50 controls the amount of light emission of each of the micro light-emitting elements 100 to display an image.

Figure 3:
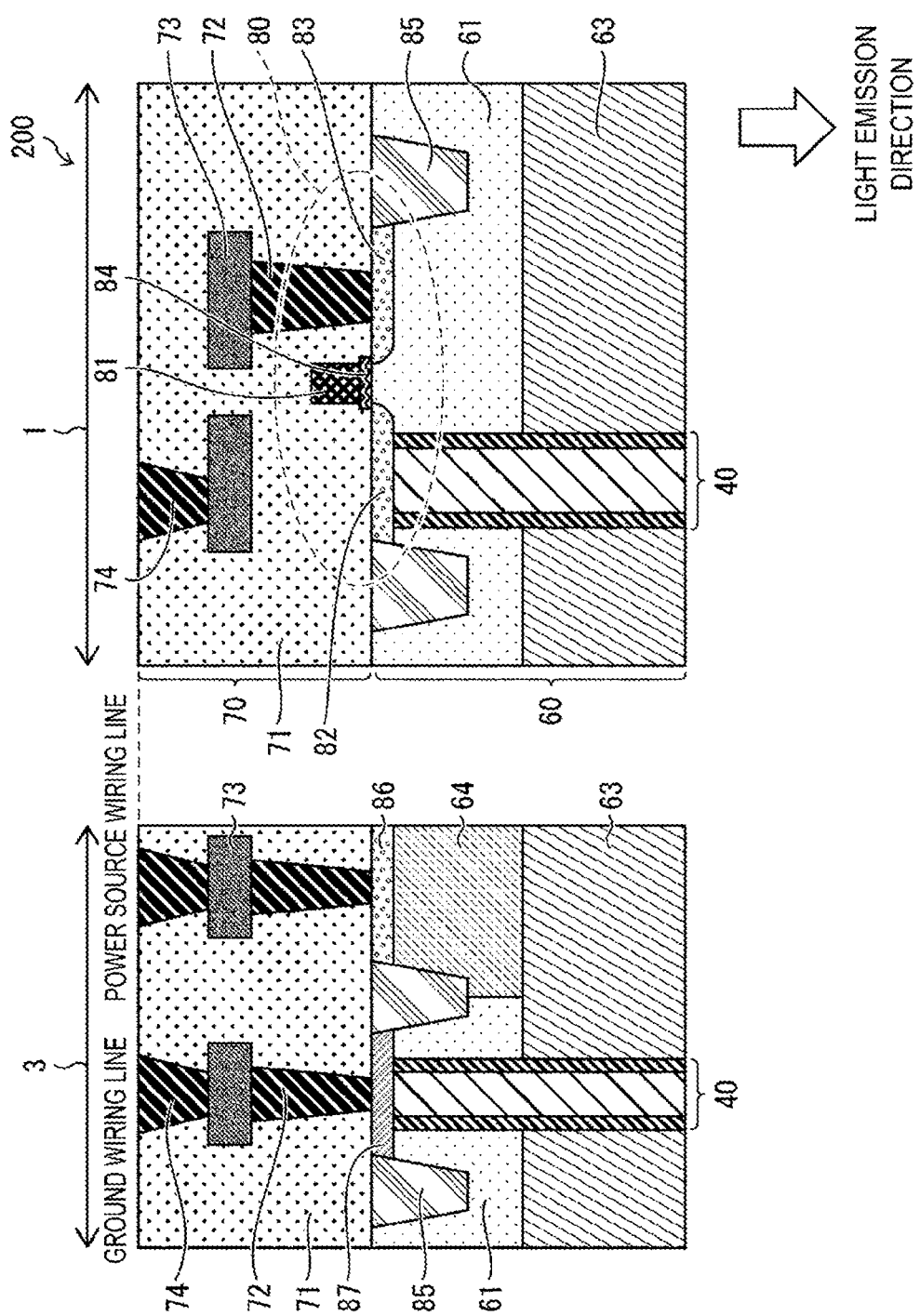
FIG. 3 is a schematic cross-sectional view of a transistor and its surroundings that constitute a drive circuit of the image display element according to the first embodiment of the present disclosure.

As illustrated in FIG. 3, the wiring layer 70 includes wiring line portions (72, 73, 74, and the like) made mainly of aluminum or copper, and an interlayer insulating film 71 that provides insulation between wiring lines. A transparent insulating film such as a silicon oxide film is used for the interlayer insulating film 71. Thus, within the wiring layer 70, it is not possible to completely block the optical path of light. This is because abandonment of the transparent insulating film with the aim of completely blocking the optical path of light leads to a short circuit between wiring lines. In related techniques, the micro light-emitting element 100 is disposed at the first surface side of the semiconductor layer 60, in other words, at the upper side of the wiring layer 70 in FIG. 3. Thus, of the light emitted by the micro light-emitting element 100, it is not avoidable that a certain amount of light leaked toward the wiring layer 70 side that is an opposite side of the light emitting direction reaches the semiconductor layer 60. The light that has reached the semiconductor layer 60 is absorbed at or around the diffusion layer that constitutes the source and drain of the transistor, causing a leakage current.

In the present configuration, the micro light-emitting element 100 is disposed at the second surface of the semiconductor layer 60, in other words, at the surface that is an opposite side of the wiring layer 70. Of the light emitted by the micro light-emitting element 100, light leaked toward the semiconductor layer 60 side that is an opposite side of the light emitting direction is absorbed by the semiconductor layer 60, and does not reach the transistor 80 or its surroundings. Thus, it is possible to prevent occurrence of the leakage current in the transistor 80. It is preferable to set the thickness of the semiconductor layer 60 in a range of approximately 2 μm to 20 μm. The absorption coefficient of silicon reduces with increase in the wavelength. Thus, the thickness of the semiconductor layer 60 needs to increase as the light emission wavelength increases.

Such a structure can be manufactured in the following manner. Polishing is applied to a surface (second surface), which is an opposite side of a surface where the transistor 80 and the wiring layer 70 are formed, of a silicon substrate at which the drive circuit is formed, whereby a portion of the silicon substrate has a desired thickness. This makes it possible to obtain the wiring layer 70 and the semiconductor layer 60. Then, a hole that reaches the first surface side of the semiconductor layer 60 is opened from the second surface side of the semiconductor layer 60, and an insulating film is formed at the interior of the hole. The hole is not completely filled with the insulating film, and a space is left at the central portion of the hole. The insulating film at the base of the hole is removed, and the insulating film is left at the sidewall of the hole. This makes it possible to form a through substrate via protection film 41.

Next, a space surrounded by the through substrate via protection film 41 is filled with a conductive body to form a through substrate via conductive portion 42. A known technique can be used for these manufacturing steps. In this manner, the through substrate via 40 is formed and the micro light-emitting element 100 is bonded through the electrode connection section 20 to form the image display element 200. Details thereof do not relate to the present disclosure, and hence, will not be described.

The planar shape of the through substrate via 40 may be any shape such as a circular shape, quadrilateral shape, or a rectangular shape. Any material can be used for the insulating film as long as the insulating film can be formed through a chemical vapor deposition (CVD) method, an atomic layer deposition (ALD) method, or the like. A metal or a semiconductor may be used for the conductive body that constitutes the through substrate via conductive portion 42. The dimension of the through substrate via 40 in the horizontal direction may gradually decrease from the second surface of the semiconductor layer 60 toward the first surface, or may be constant.

Figure 2:
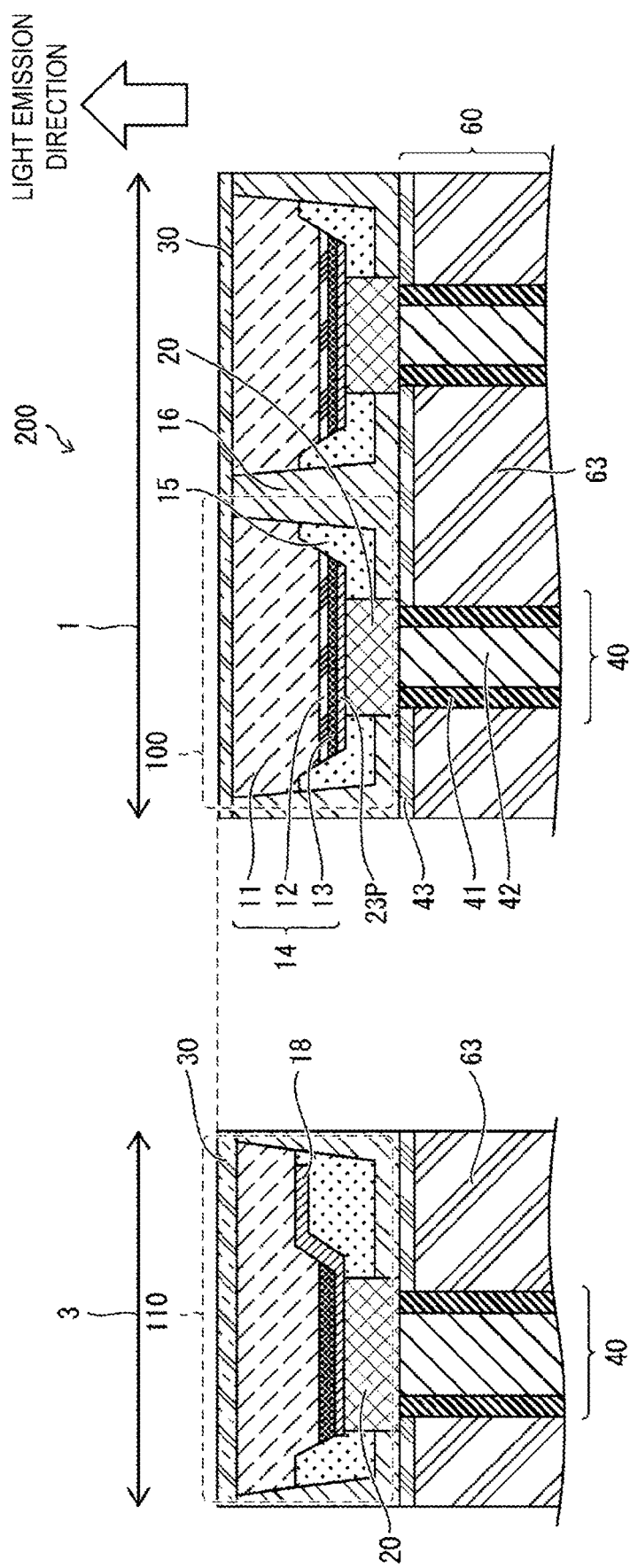
FIG. 2 is a schematic cross-sectional view of a connection section of a micro light-emitting element and a semiconductor layer of the image display element according to the first embodiment of the present disclosure.

FIG. 2 illustrates a cross-sectional view of the micro light-emitting element 100, the semiconductor layer 60 thereof, and a connection section. FIG. 2 is a cross-sectional view of the second surface side of the semiconductor layer 60. As for the semiconductor layer 60, illustration is given only for a portion (a portion of the semiconductor layer main body 63) of the semiconductor layer 60 that is disposed at the side where the micro light-emitting element 100 is coupled. The micro light-emitting elements 100 are individually separated, and side surfaces of the light emission layer 12 of the micro light-emitting element 100 are covered with an electrically insulating protection film 15. The P electrode 23P is disposed so as to be in contact with the P-type layer 13, and may be configured using a metal material having high reflectivity such as silver or aluminum, or may be obtained by layering a plurality of layers made of different metal materials. Alternately, it may be possible to employ a structure in which a transparent conductive film, a dielectric multilayer film, and a metal film are layered from the P-type layer 13 side.

The N electrode 30 is a transparent conductive film, and may be, for example, an oxide semiconductor such as Indium-Tin-Oxide (ITO) or Indium-Zinc-Oxide (IZO), or may be a silver nanofiber film or the like. In the pixel area 1, the N electrode 30 is in contact with the N-type layer 11. As illustrated in FIG. 2, in the connection area 3, the N electrode 30 is in contact with the N-type layer 11, and is electrically conductive to the N-wiring line 18 through the N-type layer 11. The N electrode 30 and the N-wiring line 18 may be directly conductive to each other.

The electrode connection section 20 is a connection member including a bump, a paste, an anisotropic conductive film, or the like. The electrode connection section 20 may be disposed at the P electrode 23P side to be coupled to the through substrate via 40 or may be disposed at the through substrate via 40 side to be coupled to the P electrode 23P. Alternately, a portion of the electrode connection section 20 may be disposed at both the P electrode 23P side and the through substrate via 40 side and be affixed.

The through substrate via 40 includes the through substrate via conductive portion (conductive body) 42 that extends through the semiconductor layer 60, and the through substrate via protection film (insulating layer) 41 that covers the periphery of the through substrate via conductive portion 42. In addition, a semiconductor layer protection film 43 is disposed at a surface side of the semiconductor layer 60 where the micro light-emitting element 100 is bonded. The semiconductor layer protection film 43 prevents a current from flowing between adjacent P electrodes 23P via the semiconductor layer 60. However, this may not be provided in a case where a current does not flow between the electrode connection section 20 and the semiconductor layer 60 by a voltage applied to the electrode connection section 20 in order to cause the micro light-emitting element 100 to emit light. The through substrate via protection film 41 and the semiconductor layer protection film 43 include an insulating film made of SiO2 or SiN, and are transparent. In order to suppress the transmission of light, it is preferable to set the thickness thereof to not more than 200 nm. In addition, in order to reduce the entry of light into the through substrate via protection film 41, it is preferable that the surface of the through substrate via 40 is completely covered with the electrode connection section 20. In other words, it is preferable that both surfaces of the through substrate via conductive portion 42 and the through substrate via protection film 41 are covered with the electrode connection section 20. With such a structure, it is possible to prevent light from passing through the through substrate via protection film 41 and entering the interior of the semiconductor layer 60.

FIG. 3 illustrates an enlarged view of the transistor 80 and its surrounding portions. FIG. 3 is a cross-sectional view of the first surface side of the semiconductor layer 60. Note that the upper-downward directions in FIG. 3 are inverted from those in FIG. 1A for the purpose of facilitating illustration. The micro light-emitting element 100 is disposed at the lower side in FIG. 3. As for the semiconductor layer 60, only a portion thereof at the transistor 80 side is illustrated. In the pixel area 1, an NMOS transistor that supplies a current to the micro light-emitting element 100 through the through substrate via 40 is illustrated as an example. In the P-well 61, a source 82 and a drain 83 are disposed, and are separated from other transistors using a trench isolation 85. Both the source 82 and the drain 83 are N diffusion layers. A gate electrode 81 is provided between the source 82 and the drain 83 through a gate insulating film 84. The source 82 and the through substrate via 40 are coupled. The wiring layer 70 includes a contact plug 72, the first-layer wiring line 73, a via plug 74, an interlayer insulating film 71, and the like. In FIG. 3, only the first-layer wiring line 73 is illustrated, and wiring lines at the second and subsequent layers are not illustrated. However, the wiring layers include a plurality of layers. In addition, in FIG. 3, the gate electrode 81 and the first-layer wiring line 73 are illustrated in a manner that they are not connected to other items. However, these are assumed to be connected to other wiring lines at the side going behind the paper plane or the side coming out of the paper plane. Although illustration is not given, there is disposed a PMOS-FET formed within the N-well (second well) 64.

Upon application of a positive voltage to the gate electrode 81, the transistor 80 becomes conductive. A current supplied from the first-layer wiring line 73 passes from the drain 83 to the source 82. Then, a current flows from the source 82 through the through substrate via 40 to the micro light-emitting element 100 disposed at an opposite side of the semiconductor layer 60.

In the present configuration, in the connection area 3 in FIG. 3, the through substrate via 40 coupled to the N electrode 30 is coupled to a wiring line (for example, a ground wiring line) through a P-type diffusion layer 87. In the present configuration, the through substrate via 40 and the ground line are coupled without using the transistor 80. However, with a structure similar to that in the pixel area 1, they may be coupled via the transistor 80. As illustrated in the connection area 3, the N-well 64 is supplied with a power supply voltage from a power source wiring line through the N-type diffusion layer 86 coupled to the N-well 64.

On the contrary to the known art, in a case of the present configuration, by disposing the micro light-emitting element 100 at a surface of the semiconductor layer 60 that is disposed at an opposite side of the wiring layer 70, it is possible to prevent light emitted by the micro light-emitting element 100 from entering the transistor 80 or its surroundings to cause a leakage current to occur in the transistor 80.

Thus, the accuracy of operation of circuits increases, which makes it possible to improve the accuracy in displaying an image. Furthermore, in the present configuration, the thickness of the semiconductor layer 60 reduces, which leads to a reduction in the thermal resistance resulting from the semiconductor layer 60. Thus, heat generated by the micro light-emitting element 100 can be quickly dissipated. This makes it possible to reduce an increase in temperatures of the micro light-emitting element 100, which makes it possible to improve a luminous efficiency.

Second Embodiment

Figure 4:
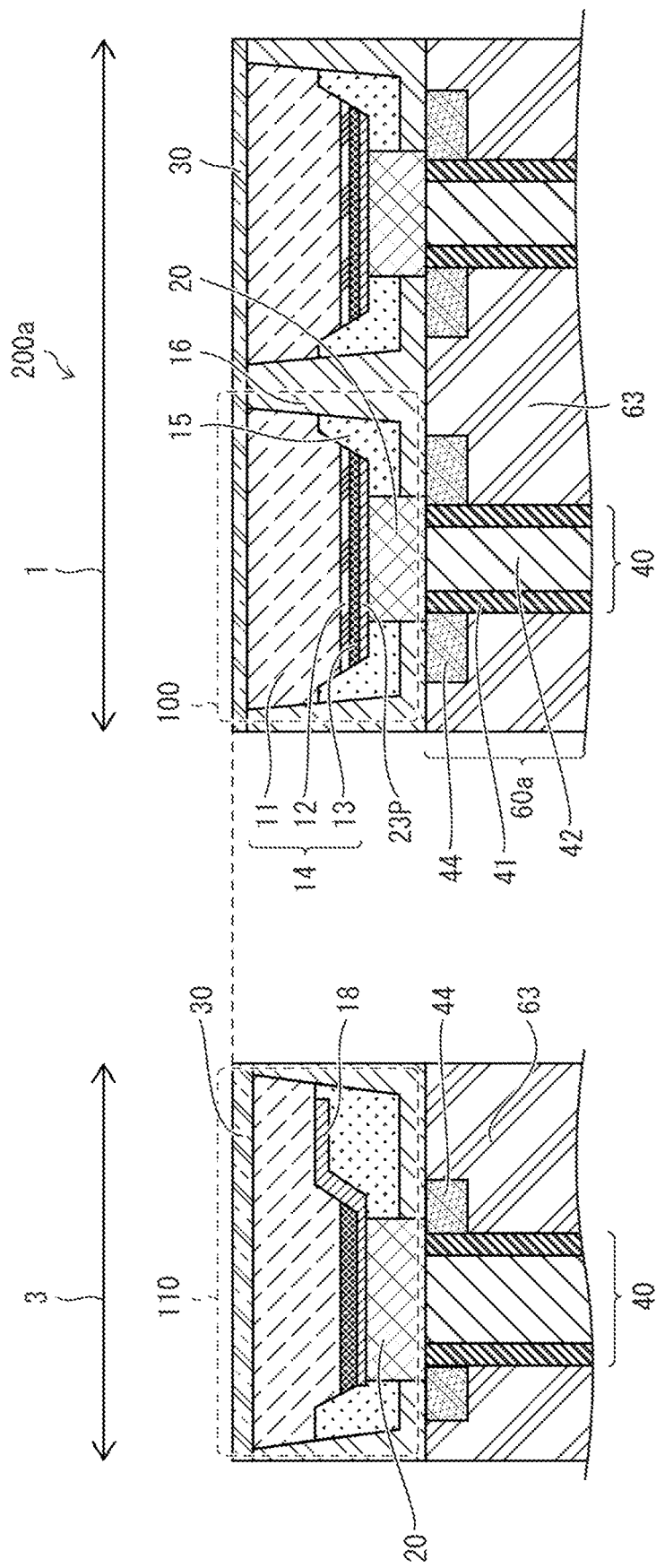
FIG. 4 is a schematic cross-sectional view of a connection section of a micro light-emitting element and a semiconductor layer of an image display element according to a second embodiment of the present disclosure.

A second embodiment will be described with reference to FIG. 4. In an image display element 200a according to the present configuration, only the configuration of a semiconductor layer 60a differs from the first embodiment. Other points are similar to those in the first embodiment. In the first embodiment, the semiconductor layer protection film 43 is disposed at a surface of the semiconductor layer 60 where the micro light-emitting element 100 is disposed. However, in the present configuration, a protection diffusion layer 44 is provided.

In the present configuration, the protection diffusion layer 44 is disposed in order to prevent occurrence of a leakage current between electrode connection sections 20 of adjacent micro light-emitting elements 100. The protection diffusion layer 44 has a conductivity type (N-type conductive layer in the present embodiment) opposite to the semiconductor layer main body 63. The protection diffusion layer 44 surrounds the periphery of the through substrate via 40, and is formed at the surface portion of the semiconductor layer 60a. The protection diffusion layer 44 is partitioned for each adjacent through substrate via 40. In the present configuration, the electrode connection section 20 is in direct contact with the protection diffusion layer 44. In other words, the electrode connection section 20 is in direct contact with silicon, and hence, it is possible to prevent light from entering the through substrate via protection film 41. Between adjacent electrode connection sections, an NPN junction is formed at the surface of the semiconductor layer 60a, and hence, no leakage current is generated.

With the present configuration, it is possible to achieve an effect similar to that of the first embodiment.

Third Embodiment

A third embodiment will be described with reference to FIG. 5. In an image display element 200b of the present configuration, only the configuration of a semiconductor layer 60b differs from the first embodiment. Other points are similar to those in the first embodiment. The image display element 200b differs from that in the first embodiment in that a deep N-well (third well) 62 is added in the pixel area 1.

In the present configuration, a triple-well structure is employed in the semiconductor layer 60b. In addition to the P-well (first well) 61 and the N-well (second well) 64 used to configure a CMOS circuit, the deep N-well (third well) 62 is provided. The deep N-well 62 is used to electrically separate the P-well 61 from the semiconductor layer main body 63 of the semiconductor layer 60b. A power supply voltage is applied to the deep N-well 62, and reverse biasing is applied to a junction between the P-well 61, which is maintained at a ground level, and the deep N-well 62. This results in generation of a depletion layer. This depletion layer is used to capture a carrier generated by light that reaches the transistor 80 of the semiconductor layer 60b and its surrounding. This makes it possible to prevent occurrence of a leakage current of the transistor. In a case where the wavelength of light generated from the micro light-emitting element 100 is extremely long or in a case where infrared light enters the image display element 200b, light cannot be completely absorbed unless the semiconductor layer 60b has an extremely large thickness. However, the more the thickness of the semiconductor layer 60b increases, the more it is difficult to manufacture the through substrate via 40. Thus, a certain amount of light entry is allowed, and by using such a triple-well structure, it is possible to suppress occurrence of a leakage current. Note that, in a case of a typical manufacturing method, the semiconductor layer main body 63 corresponds to the original silicon substrate or corresponds to a portion of an epitaxial layer if the epitaxial layer exists, and a triple-well structure is a well structure that is to be created in a later step.

Figure 5:
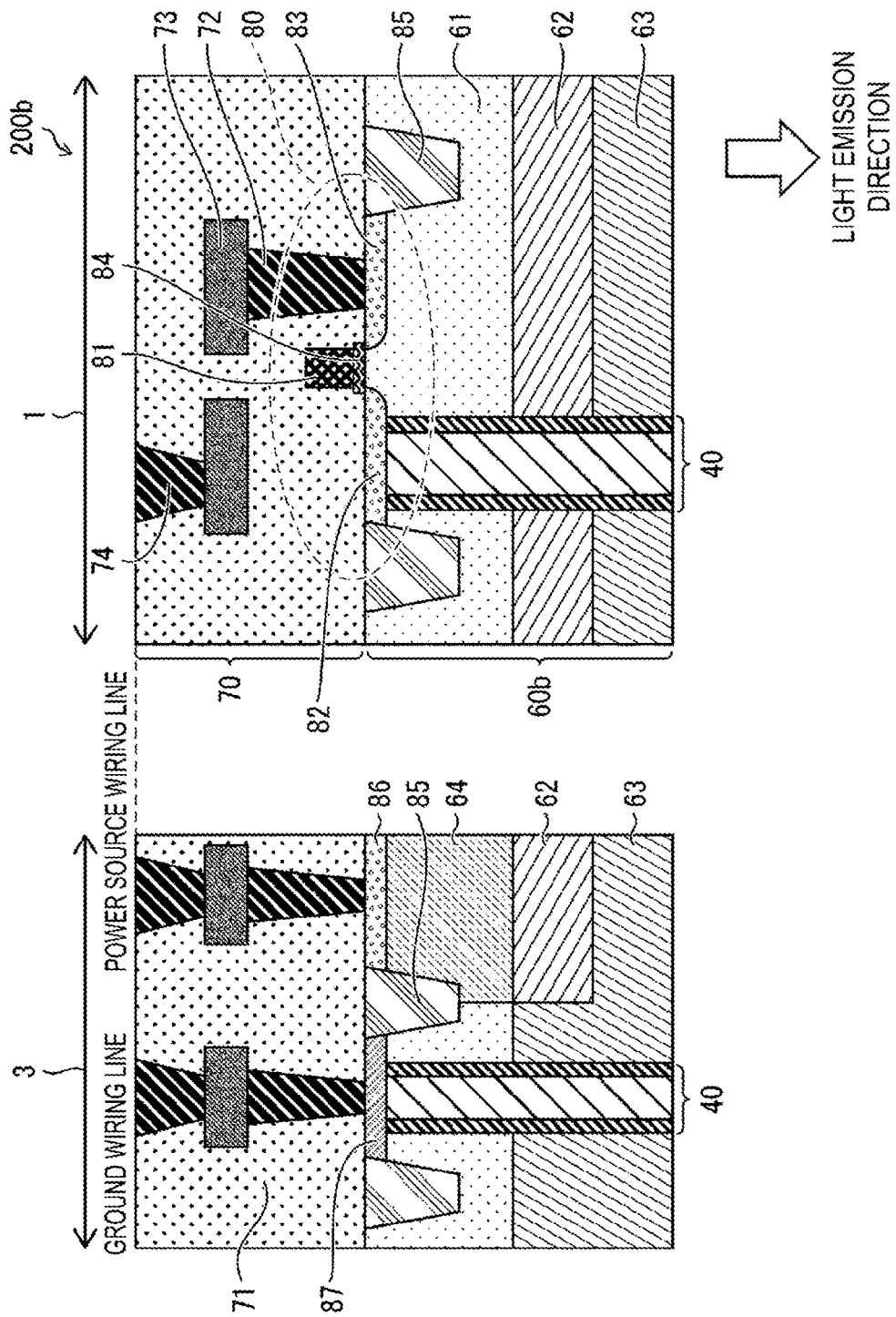
FIG. 5 is a schematic cross-sectional view of a transistor and its surroundings that constitute a drive circuit of an image display element according to a third embodiment of the present disclosure.

In the connection area 3 in FIG. 5, the deep N-well 62 and the N-well 64 are coupled, and are supplied with a power supply voltage from a power source wiring line through the N-type diffusion layer 86 coupled to the N-well 64.

With the present configuration, it is also possible to achieve an effect similar to that of the first embodiment.

Fourth Embodiment

A fourth embodiment will be described with reference to FIG. 6. In an image display element 200c of the present configuration, only the configuration of a micro light-emitting element 100c differs from the first embodiment. Other points are similar to those in the first embodiment. The micro light-emitting element 100c differs from the first embodiment in that the P-type layer 13 is disposed in a light emitting direction, the electrode connection section 20 is not provided, and a partition 24 is provided at the periphery.

The configuration of the micro light-emitting element 100 according to the first to third embodiments is suitable for a manufacturing method in which the micro light-emitting element 100 is first processed into a desired shape and is affixed with the semiconductor layer 60 via the electrode connection section 20 to form the micro light-emitting element 100 as an image display element. For example, on a substrate where the compound semiconductor layer 14 is caused to grow, the compound semiconductor layer 14 is processed to form the protection film 15 and the P electrode 23P. Then, the protection film 15 and the P electrode 23P are bonded to the semiconductor layer 60 via the electrode connection section 20, and the underfill 16 is formed. After this, the substrate is peeled, and the N electrode 30 is formed, thereby completing the image display element 200. In other words, on the semiconductor layer 60, processing of the compound semiconductor layer 14, formation of the protection film 15, the P electrode 23P, or the like are not performed. The micro light-emitting element 100c according to the present configuration is suitable for a manufacturing method in which these steps related to manufacturing of the micro light-emitting element 100c are performed on the semiconductor layer 60. An advantage of implementing these steps on the semiconductor layer 60 is that precise positional alignment is not necessary at the time of affixing the semiconductor layer 60 and the compound semiconductor layer 14.

Figure 6:
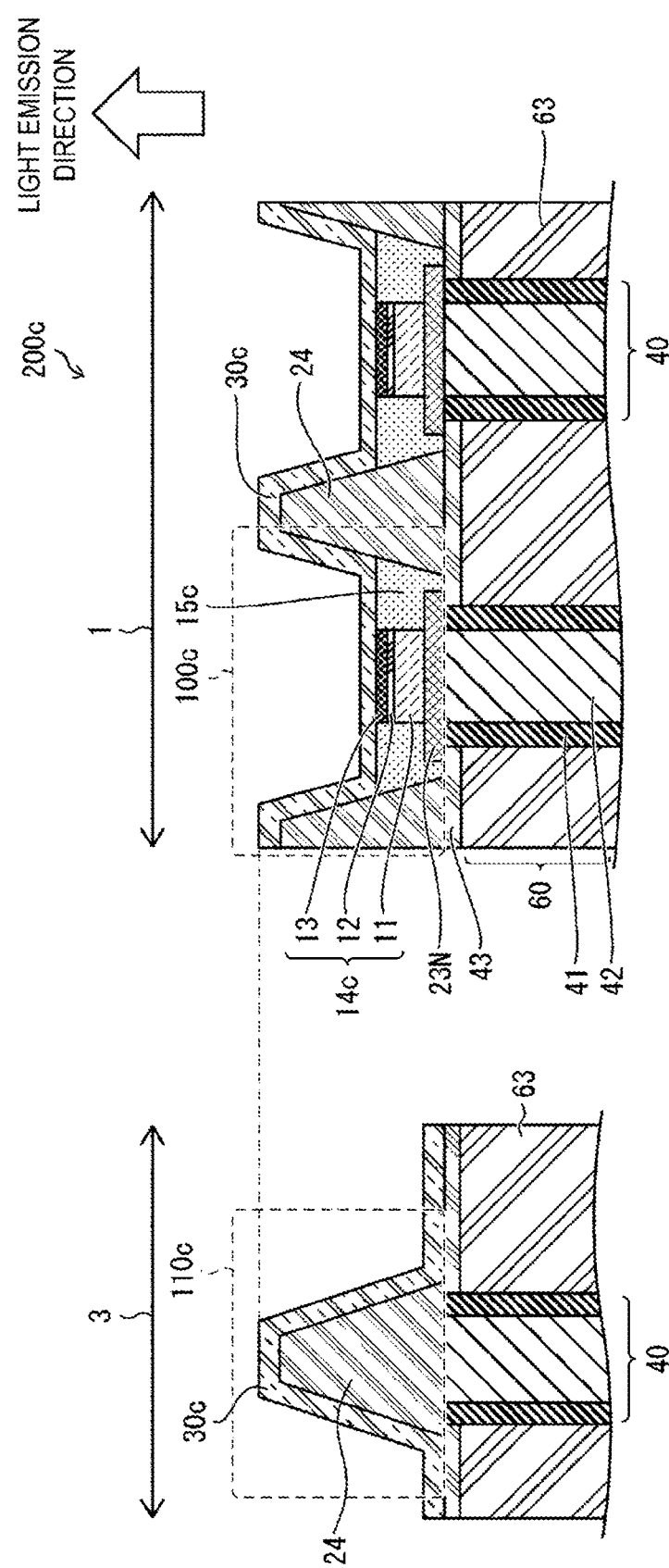
FIG. 6 is a schematic cross-sectional view of a connection section of a micro light-emitting element and a semiconductor layer of an image display element according to a fourth embodiment of the present disclosure.

As illustrated in FIG. 6, in the micro light-emitting element 100c, an N electrode 23N (second electrode) is disposed on the through substrate via 40, and a compound semiconductor layer 14c is disposed on the N electrode 23N. The N electrode 23N covers the whole of the through substrate via 40 so that the through substrate via protection film 41 is not exposed. The compound semiconductor layer 14c includes the N-type layer 11, the light emission layer 12, and the P-type layer 13 layered in this order from the N electrode 23N side. The partition 24 is provided between adjacent N electrodes 23N. It is preferable that the partition 24 has an electrical conductivity. The partition 24 surrounds the outer periphery of the micro light-emitting element 100c, and is disposed in a mesh manner in a plan view. It is preferable that at least a side surface of the partition 24 has light reflectivity. It is possible to suppress emission of light from the micro light-emitting element 100c to an adjacent portion, and it is also possible to prevent optical crosstalk.

In addition, it is preferable that a side surface of the partition 24 is sloped so as to be opened toward the light emitting direction. By causing light emitted in the horizontal direction to be reflected toward the light emitting direction, it is possible to improve the efficiency of light emission. Thus, the partition 24 may be one mainly composed of a material having high reflectivity for visible light, such as silver or aluminum, or may be a composite member obtained by disposing these metal materials at least at the surface and configuring the interior using an inorganic material or organic material.

The periphery of the compound semiconductor layer 14c is covered with a protection film 15c. The protection film 15c is an insulating film that is transparent for light emitted by the micro light-emitting element 100c. The surface of the P-type layer 13 of the compound semiconductor layer 14c is exposed from the protection film 15c, and is in contact with a P electrode 30c (first electrode). The P electrode 30c is a transparent electrode. In FIG. 6, the protection film 15c is embedded so as to be flush with the surface of the P-type layer 13 of the compound semiconductor layer 14c, and has a flat surface. However, the protection film 15c may cover the N electrode 23N or the compound semiconductor layer 14c with a certain thickness.

In the connection area 3, the partition 24 is in contact with the through substrate via 40. That is, in the configuration illustrated in FIG. 6, the connection element 110c includes the partition 24 and the P electrode 30c. However, the P electrode 30c may not be provided. Alternately, it may be possible to employ a configuration in which the structure same as the N electrode 23N or the compound semiconductor layer 14c in the pixel area 1 is disposed and the partition 24 is disposed in a layered manner. The partition 24 is continuously disposed from the pixel area 1 to the connection area 3 to reduce the wiring line resistance at the first electrode side of the micro light-emitting element 100c. This makes it possible to reduce the thickness of the P electrode 30c that is a transparent electrode, which makes it possible to reduce the absorption of light at the P electrode 30c to improve the output of light.

In the present configuration, the area of the compound semiconductor layer 14c that occupies the micro light-emitting element 100c is very small. Thus, as described above, bonding the entire compound semiconductor layer 14 so the semiconductor layer 60 in order to avoid the precise positional alignment, and then performing processing to obtain the compound semiconductor layer 14c having a box shape as illustrated in FIG. 6, result in a loss of a compound semiconductor layer that has existed between the box shaped parts of the compound semiconductor layers 14c. A large amount of compound semiconductor layer is wasted. In order to avoid the loss of compound semiconductor layer 14 described above, it is only necessary to employ a manufacturing method in which the compound semiconductor layer 14c that has been processed in advance into a box shape is thinned out, and is transferred onto the semiconductor layer 60. In this case, while the loss of the compound semiconductor layer 14c can be reduced to achieve the effective use, the precise positional alignment is still necessary. In this manner, with the present configuration in which the area of the compound semiconductor layer 14c that occupies the micro light-emitting element 100c is very small, is possible to effectively utilize the compound semiconductor layer.

With the present configuration, it is preferable to use a metal material for the N electrode 23N and the partition 24, and it is possible to prevent light from leaking from these portions into the semiconductor layer 60. However, space always exists in the N electrode 23N and the partition 24, and hence, light leaks into the semiconductor layer 60. The leaking light is absorbed by the semiconductor layer 60, and does not reach the transistor 80. Thus, with the present configuration, is also possible to achieve an effect similar to that of the first embodiment.

Fifth Embodiment

Figure 7:
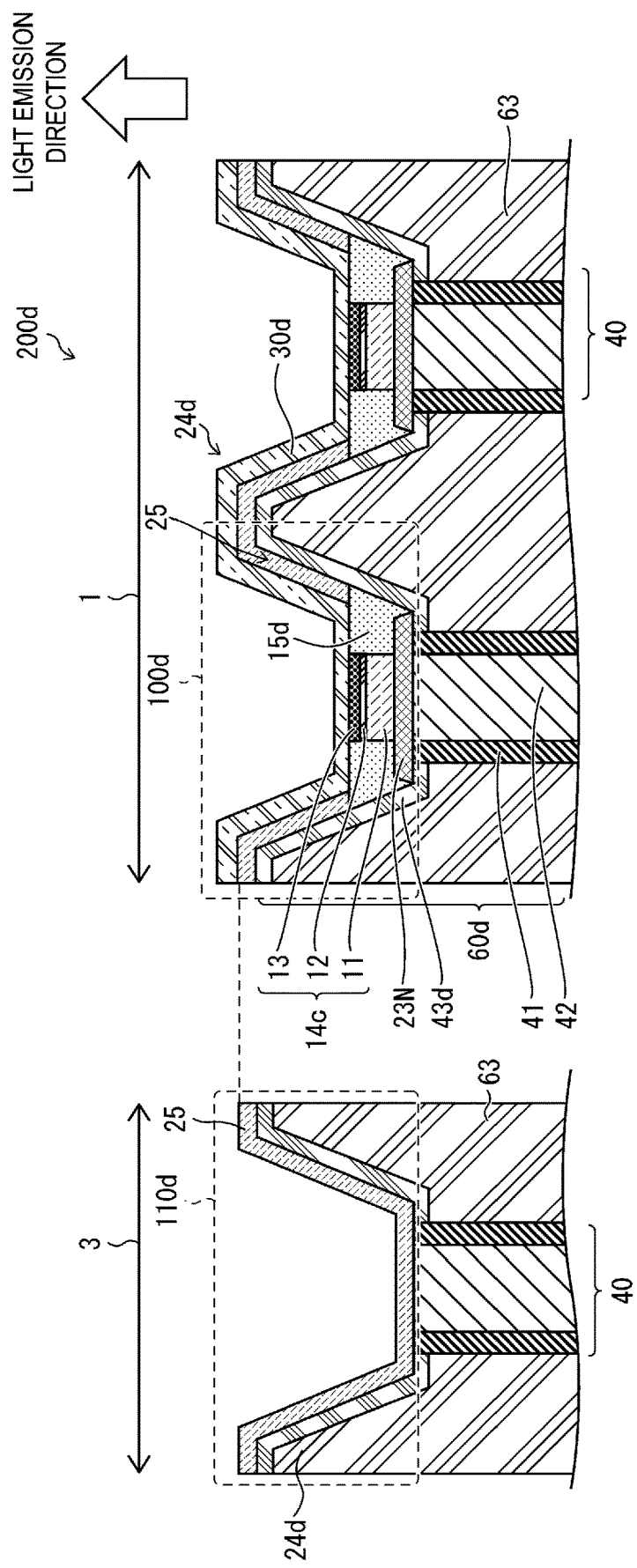
FIG. 7 is a schematic cross-sectional view of a connection section of a micro light-emitting element and a semiconductor layer of an image display element according to a fifth embodiment of the present disclosure.

A fifth embodiment will be described with reference to FIG. 7. An image display element 200d according to the present configuration is similar to the fourth embodiment, but differs from the fourth embodiment in that a surface portion of a semiconductor layer 60d is used as the configuration of the partition 24d.

In the first to fourth embodiments, the surface of the semiconductor layer 60 disposed at the micro light-emitting element 100 side is flat. However, as illustrated in FIG. 7, the surface of the semiconductor layer 60d is indented into a bath tab shape. The through substrate via 40 is disposed at the base of a recessed portion, and a protruding portion constitutes a main body portion of a partition 24d. A semiconductor layer protection film 43d is formed at the surface of the semiconductor layer 60d. The N electrode 23N is disposed at the bottom of the recessed portion so as to cover the whole of the through substrate via 40, which is the same as the fourth embodiment. A partition reflective layer 25 is disposed at a sidewall surface of the partition 24d. The partition reflective layer 25 is configured with a thin film having high electrical conductivity and having a high reflective property for visible light. For example, it contains a metal film mainly composed of silver or aluminum. The present configuration has an advantage in that the N electrode 23N and the partition reflective layer 25 can be formed at the same time using the same material. In the micro light-emitting element 100d, the protection film 15d that covers the compound semiconductor layer 14c is provided and the P electrode 30d comprised of a transparent electrode is provided, which are similar to the fourth embodiment.

As in the pixel area 1, in the connection area 3, a recess and a protrusion are formed on the surface of the semiconductor layer 60d, and the through substrate via 40 is disposed at the bottom of the recessed portion. The through substrate via 40 is coupled to the partition reflective layer 25. The partition reflective layer 25 is continuously connected from the pixel area 1, and forms a wiring line at the first electrode side. The connection element 110d includes the partition 24d. Note that, in FIG. 7, in the connection area 3, the P electrode 30d is removed. However, the P electrode 30d may be disposed as in the fourth embodiment.

With the present configuration, it is possible to achieve an effect similar to that in the first embodiment.

Sixth Embodiment

A sixth embodiment will be described with reference to FIG. 8. In an image display element 200e according to the present configuration, the configuration of the micro light-emitting element is similar to that in the fourth embodiment, but differs in that the image display element 200e is a full color display element. The display element according to the first to fifth embodiments is a monochrome display, and light outputted from the compound semiconductor layer 14 is emitted directly to the outside. In the present configuration, the micro light-emitting element includes an excitation light emitting element 105 and a wavelength conversion portion (a blue wavelength conversion portion 31, a red wavelength conversion portion 32, and a green wavelength conversion portion 33). The excitation light emitting element 105 includes, for example, a nitride semiconductor layer 14e, an N electrode (second electrode) 23N, and a P electrode (first electrode) 30c, and emits ultraviolet light, near-ultraviolet light, blue light, or the like as excitation light. The wavelength conversion portion disposed at the light emitting surface side of the excitation light emitting element 105 absorbs the excitation light, and outputs down-converted long wavelength light to the outside. The wavelength conversion portion is disposed so as to fill the bath tab shaped region surrounded by the partition 24.

Figure 8:
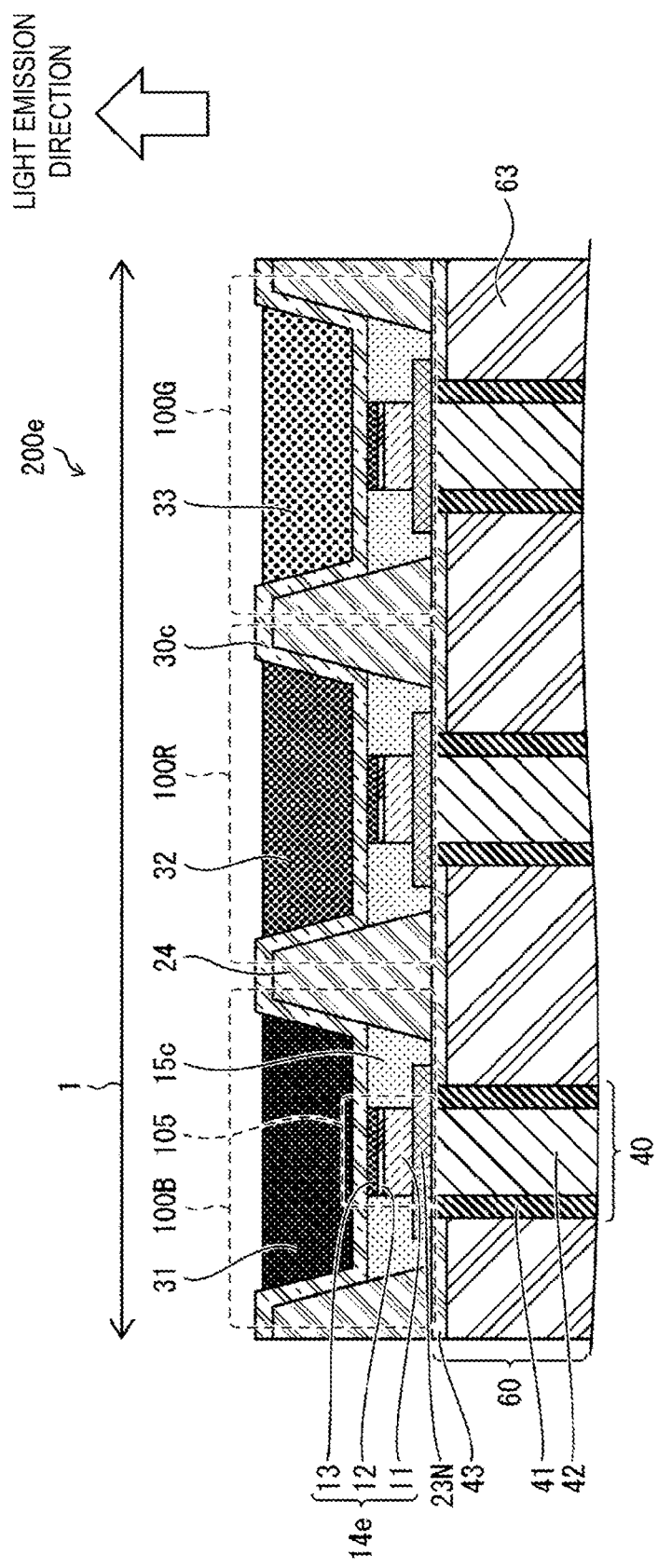
FIG. 8 is a schematic cross-sectional view of a connection section of a micro light-emitting element and a semiconductor layer of an image display element according to a sixth embodiment of the present disclosure.

As illustrated in FIG. 8, the blue micro light-emitting element 100B is configured such that the blue wavelength conversion portion 31 is disposed on the excitation light emitting element 105. The blue wavelength conversion portion 31 absorbs excitation light outputted by the excitation light emitting element 105, and outputs blue light. The blue wavelength conversion portion 31 is, for example, a resin layer including phosphor particles, quantum dot particles, or dye comprised of fluorescent molecules. The periphery of the blue wavelength conversion portion 31 is surrounded by the partition 24 to prevent light from leaking to a red micro light-emitting element 100R, a green micro light-emitting element 100G, or a blue micro light-emitting element 100B that belongs to another pixel. In addition, the sidewall of the partition 24 is sloped so as to be opened toward the light emitting direction, which makes it possible to improve the efficiency of light emission.

The red micro light-emitting element 100R and the green micro light-emitting element 100G are similar to the blue micro light-emitting element 100B except that the red wavelength conversion portion 32 and the green wavelength conversion portion 33 are made of different materials. In addition, in a case where the excitation light emitting element 105 is configured so as to emit blue light, the blue wavelength conversion portion 31 is not necessary. However, by disposing a transparent resin portion instead of the blue wavelength conversion portion 31, it is possible to improve the light extraction efficiency.

With the present configuration, there is a possibility that not only the excitation light outputted by the excitation light emitting element 105 but also down-converted blue light, green light and red light penetrate into the transistor 80 and its surroundings. In particular, absorption coefficient of silicon for red light is small. Thus, by setting the thickness of the semiconductor layer 60 so as to prevent the entry of the red light, it is possible to prevent all light including the excitation light from entering.

With the present configuration, it is possible to achieve an effect similar to that in the first embodiment. Furthermore, full color display can be achieved by a single image display element.

Seventh Embodiment

Figure 9:
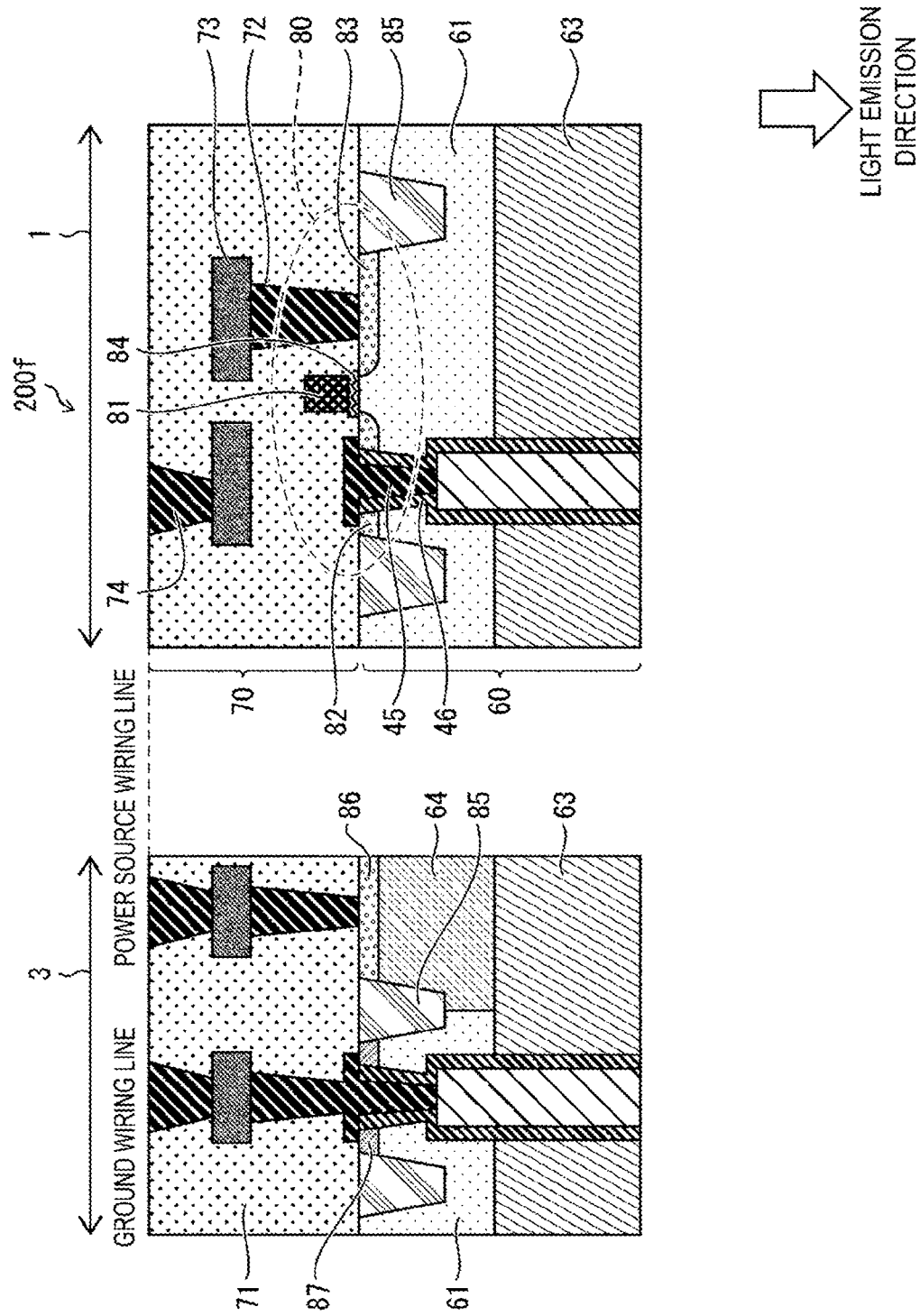
FIG. 9 is a schematic cross-sectional view of a transistor and its surroundings that constitute a drive circuit of an image display element according to a seventh embodiment of the present disclosure.

A seventh embodiment will be described with reference to FIG. 9. An image display element 200f according to the present configuration differs from the image display element 200 according to the first embodiment in that a connecting electrode 45 used to connect the through substrate via 40 and the diffusion layer or the like of the transistor 80 is provided at the first surface. Other points are the same as those in the first embodiment.

The through substrate via 40 can be more easily formed in a case where the dimension in the horizontal direction is larger. However, if the large sized through substrate via 40 is directly coupled to the transistor 80 or the like, it is necessary to form, at the first surface, a diffusion layer having a large area. This is not preferable in terms of a reduction in the pixel area. In this respect, the connecting electrode 45 is formed, up to the inside of the semiconductor layer 60, from the diffusion layer that constitutes the source 82 of the transistor 80 formed at the first surface, and the through substrate via 40 is coupled to the connecting electrode 45. This makes it possible to prevent an increase in the area of the diffusion layer. The connecting electrode 45 can be formed in the following manner. A hole having a small diameter is formed from the source 82 or the P-type diffusion layer 87 toward the interior of the semiconductor layer 60, and a connecting electrode protection film 46 is formed at the interior of the hole. An insulating film can be left only at the sidewall of the hole by depositing an insulating film made of SiO2 or the like through CVD, and applying etch back through a dry etching method. Then, a space of the hole that is not covered with the connecting electrode protection film 46 is filled with a conductive material to form the connecting electrode 45. It is preferable that the connecting electrode 45 is in contact with the surface of the diffusion layer at the first surface side, and is electrically coupled to the source 82 or the P-type diffusion layer 87.

The connecting electrode 45 can be formed in a limited area. By forming the connecting electrode 45 at the first surface, it is possible to use the through substrate via 40 having a large cross sectional area in the horizontal direction. Thus, it is possible to easily manufacture the through substrate via 40.

With the present configuration, it is possible to achieve an effect similar to that in the first embodiment.

Supplement

An image display element according to a first aspect of the present disclosure provides an image display element including: a plurality of micro light-emitting elements arrayed in an array manner; and a semiconductor layer at which a drive circuit is disposed, the drive circuit being configured to cause the plurality of micro light-emitting elements to emit light, in which a transistor that constitutes the drive circuit and a wiring layer are disposed at a first surface of the semiconductor layer, the plurality of micro light-emitting elements are disposed at a second surface of the semiconductor layer that is an opposite side of the first surface, and the transistor and the wiring layer are electrically coupled to the micro light-emitting elements through a through substrate via that extends through the semiconductor layer.

With the present configuration, the micro light-emitting element is disposed at a surface of the semiconductor layer that is disposed at an opposite side of the wiring layer. This makes it possible to prevent occurrence of a leakage current in the transistor resulting from entry of light outputted by the micro light-emitting element into or around the transistor.

In the first aspect, the image display element according to a second aspect at the present disclosure is configured such that the through substrate via has a cross section in a plan view in which an insulating layer is disposed outside and a conductive body is disposed inside.

In the first or second aspect, the image display element according to a third aspect of the present disclosure is configured such that the through substrate via is provided for each of the micro light-emitting elements.

In any one of the first to third aspects, the image display element according to a fourth aspect of the present disclosure is configured such that, at the second surface, the through substrate via is entirely covered with an electrode connection section.

With the configuration described above, it is possible to prevent penetration of light into an interior of the semiconductor layer.

In any one of the first to third aspects, the image display element according to a fifth aspect of the present disclosure is configured such that, at the second surface, the through substrate via is entirely covered with electrodes of the micro light-emitting elements at one side.

With the configuration described above, it is possible to prevent penetration of light into an interior of the semiconductor layer.

In any one of the first to fifth aspects, the image display element according to a sixth aspect of the present disclosure is configured such that, at the first surface, the through substrate via is coupled to an N-type diffusion layer or a P-type diffusion layer.

In any one of the first to sixth aspects, the image display element according to a seventh aspect of the present disclosure is configured such that the second surface of the semiconductor layer is covered with an insulating film except for a through substrate via.

With the configuration described above, it is possible to prevent a current from flowing between adjacent electrodes through the semiconductor layer.

In any one of the first to sixth aspects, the image display element according to an eighth aspect of the present disclosure is configured such that, at the second surface of the semiconductor layer, the through substrate via is covered with a diffusion layer having a conductivity type opposite to a semiconductor layer main body, which is an inner part of the semiconductor layer.

With the configuration described above, it is possible to prevent occurrence of a leakage current between electrode connection sections of adjacent micro light-emitting elements.

In any one of the first to eighth aspects, the image display element according to a ninth aspect of the present disclosure is configured such that, in a area where the plurality of micro light-emitting elements are disposed, a first well where the transistor is disposed is disposed at a first surface side of the semiconductor layer, and a third well having a conductivity type opposite to the first well is disposed at the second surface side of the first well.

In the aspect, the image display element according to a tenth aspect of the present disclosure is configured such that the third well is coupled to the wiring layer through a second well having a conductivity type opposite to the first well.

With the configuration described above, a depletion layer is used to catch a carrier generated as a result of light that reaches the transistor of the semiconductor layer and its surrounding, which makes it possible to prevent occurrence of a leakage current of the transistor.

In any one of the first to tenth aspects, the image display element according to an eleventh aspect of the present disclosure is configured such that the micro light-emitting elements include: a first electrode disposed at a light emitting surface side of the micro light-emitting elements; and a second electrode having a polarity opposite to the first electrode and disposed at a surface disposed at an opposite side of the light emitting surface, and the second electrode is electrically conductive to the through substrate via.

In the eleventh aspect, the image display element according to a twelfth aspect of the present disclosure is configured such that a connection area is disposed outside of the pixel area where the plurality of micro light-emitting elements are disposed, and in the connection area, a connection element that connects the first electrode of the plurality of micro light-emitting elements and the wiring layer is disposed and a through substrate via coupled to the connection element is disposed.

In any one of the first to twelfth aspects, the image display element according to a thirteenth aspect of the present disclosure is configured such that the micro light-emitting elements include an excitation light emitting element and a wavelength conversion portion.

With this configuration, it is possible to achieve full color display by a single image display element.

In any one of the first to thirteenth aspects, the image display element according to a fourteenth aspect of the present disclosure is configured such that a periphery of the micro light-emitting elements is surrounded by a partition formed at the second surface of the semiconductor layer.

With the configuration described above, by using a metal material for at least a part of the partition, it is possible to prevent leakage of light to the semiconductor layer.

In the fourteenth aspect, the image display element according to a fifteenth aspect of the present disclosure is configured such that the partition includes a protruding portion disposed at the second surface of the semiconductor layer and comprised of the semiconductor layer.

The present disclosure is not limited to each of the above-described embodiments. It is possible to make various modifications within the scope of the claims. An embodiment obtained by appropriately combining technical elements each disclosed in different embodiments falls also within the technical scope of the present disclosure. Furthermore, technical elements disclosed in the respective embodiments may be combined to provide a new technical feature.

While there have been described what are at present considered to be certain embodiments of the disclosure, it will be understood that various modifications may be made thereto, and it is intended that the appended claim cover all such modifications as fall within the true spirit and scope of the disclosure.

What is claimed is:

1. An image display element comprising:
   a plurality of micro light-emitting elements arrayed in an array manner; and
   a semiconductor layer at which a drive circuit is disposed, the drive circuit being configured to supply a current to each of the plurality of micro light-emitting elements to emit light, wherein
   the drive circuit comprises a transistor, the transistor and a wiring layer are disposed at a first surface of the semiconductor layer,
   the plurality of micro light-emitting elements is disposed at a second surface of the semiconductor layer that is an opposite side of the first surface, the transistor and the wiring layer are electrically coupled to the plurality of micro light-emitting elements through a through substrate via that extends through the semiconductor layer, the plurality of micro light-emitting elements includes:

a first electrode disposed at a light emitting surface side of the plurality of micro light-emitting elements; and a second electrode having a polarity opposite a polarity of the first electrode and disposed at a surface at an opposite side of the light emitting surface, and the second electrode is electrically conductive to the through substrate via.

2. The image display element according to claim 1, wherein the through substrate via has a cross section in a plan view in which an insulating layer is disposed outside and a conductive body is disposed inside.

3. The image display element according to claim 1, wherein the through substrate via corresponds to each of the plurality of micro light-emitting elements.

4. The image display element according to claim 1, wherein, at the second surface, the through substrate via is entirely covered with an electrode connection section.

5. The image display element according to claim 1, wherein, at the second surface, the through substrate via is entirely covered with electrodes of the micro light-emitting elements at one side.

6. The image display element according to claim 1, wherein, at the first surface, the through substrate via is coupled to an N-type diffusion layer or a P-type diffusion layer.

7. The image display element according to claim 1, wherein the second surface is covered with an insulating film except for the through substrate via.

8. The image display element according to claim 1, wherein, at the second surface of the semiconductor layer, the through substrate via is covered with a diffusion layer having a conductivity type opposite to a semiconductor layer main body which is a inner part of the semiconductor layer.

9. The image display element according to claim 1, wherein, in a pixel area where the plurality of micro light-emitting elements are disposed, a first well where the transistor is disposed is disposed at a first surface side of the semiconductor layer, and a third well having a conductivity type opposite to the first well is disposed at the second surface side of the first well.

10. The image display element according to claim 9, wherein the third well is coupled to the wiring layer through a second well having a conductivity type opposite to the first well.

11. An image display element comprising:

a plurality of micro light-emitting elements arrayed in an array manner; and a semiconductor layer at which a drive circuit is disposed, the drive circuit being configured to supply a current to each of the plurality of micro light-emitting elements to emit light, wherein the drive circuit comprises a transistor, the transistor and a wiring layer are disposed at a first surface of the semiconductor layer, the plurality of micro light-emitting elements is disposed at a second surface of the semiconductor layer that is an opposite side of the first surface, the transistor and the wiring layer are electrically coupled to the plurality of micro light-emitting elements through a through substrate via that extends through the semiconductor layer, the plurality of micro light-emitting elements includes:

a first electrode disposed at a light emitting surface side of the plurality of micro light-emitting elements; and a second electrode having a polarity opposite a polarity of the first electrode and disposed at a surface at an opposite side of the light emitting surface, the second electrode is electrically conductive to the through substrate via, a connection area is disposed outside of a pixel area where the plurality of micro light-emitting elements is disposed, and in the connection area, a connection element that connects the first electrode of the plurality of micro light-emitting elements and the wiring layer is disposed and a through substrate via coupled to the connection element is disposed.

12. The image display element according to claim 1, wherein the micro light-emitting elements include an excitation light emitting element and a wavelength conversion portion.

13. The image display element according to claim 1, wherein a periphery of the micro light-emitting elements is surrounded by a partition formed at the second surface of the semiconductor layer.

14. The image display element according to claim 13, wherein the partition includes a protruding portion disposed at the second surface of the semiconductor layer and comprised of the semiconductor layer.

* * * * *